(12) United States Patent
Cho et al.

(10) Patent No.: US 6,888,403 B2
(45) Date of Patent: May 3, 2005

(54) PULSE WIDTH MODULATION TYPE AUDIO AMPLIFIER HAVING VARIABLE AVERAGE SWITCHING FREQUENCY

(75) Inventors: Yong Hun Cho, Kyungki-Do (KR); Bong Joo Kim, Seoul (KR)

(73) Assignee: Pulsus Technologies, Seoul (KR)

( * ) Notice: Subject to any disclaimer, the term of this patent is extended or adjusted under 35 U.S.C. 154(b) by 0 days.

(21) Appl. No.: 10/222,400

(22) Filed: Aug. 16, 2002

(65) Prior Publication Data

US 2003/0035554 A1 Feb. 20, 2003

(30) Foreign Application Priority Data

Aug. 17, 2001 (KR) .......................................... 2001-49661

(51) Int. Cl.[7] ............................ H03F 3/38; H03F 3/217
(52) U.S. Cl. ..................................... 330/10; 330/207 A
(58) Field of Search ............................... 330/10, 207 A, 330/251; 381/94.5, 120, 123

(56) References Cited

U.S. PATENT DOCUMENTS 5,990,735 A * 11/1999 Sigmon et al. ............... 330/10

\* cited by examiner

Primary Examiner—Steven J. Mottola
(74) Attorney, Agent, or Firm—Volpe and Koenig, P.C.

(57) ABSTRACT

The present invention relates to an audio amplifier using a pulse width modulation, and more particularly, to a pulse width modulation type audio amplifier which an average switching frequency or a cutoff frequency of a low pass filter is variable in accordance with frequency of input signal. The present invention has a method for using average switching frequency of an output pulse by lowering the average switching frequency in accordance with the bandwidth of the input audio signal for relative narrow bandwidth than that of an input audio signal having a usual bandwidth of 20 kHz like as a pulse width modulation type radio signal and a low bandwidth signal for a subwoofer, a method for lowering a cutoff frequency of a low pass filter for restoring an output pulse to a continuous time signal together an average switching frequency of the output pulse, and a method for using respective average switching frequencies different to each other for each channel having respective different bandwidths in a multi-channel amplifier. By using the average switching frequency as lower as possible in accordance with the bandwidth of the input audio signal, the power efficiency is enhanced and the electromagnetic interference affecting peripheral devices can be minimized.

19 Claims, 3 Drawing Sheets

PULSE WIDTH MODULATION TYPE AUDIO AMPLIFIER HAVING VARIABLE AVERAGE SWITCHING FREQUENCY

BACKGROUND OF THE INVENTION

1. Field of the Invention

The present invention relates to an audio amplifier using a pulse width modulation, and more particularly, to a pulse width modulation type audio amplifier which average switching frequency or a cutoff frequency of a low pass filter is variable in accordance with frequency bandwidth of input signal.

2. Description of the Related Art

FIG. 1 is a block diagram showing a conventional pulse width modulation (PWM) audio amplifier.

As shown in FIG. 1, the conventional pulse width modulation type audio amplifier basically includes a pulse width modulator 1, a power switching amplifier 2, and a low pass filter 3.

The pulse width modulator 1 quantizes a signal inputted from external device and converts the signal into a pulse signal with a selective value among 0 (zero) and 1 (one). At that time, width of the outputted signal is determined by magnitude of the inputted signal. In other words, at time rate which each pulse to be outputted maintains 0 (zero) and 1 (one) in accordance with the magnitude of the inputted signal is continuously varied. Meanwhile, the average switching frequency for each pulse is fixed to a specific value.

Meanwhile, the power switching amplifier 2 amplifies magnitude of a pulse width modulated small signal pulse having information about the inputted signal. Finally, the low pass filter 3 converts the pulse signal amplified by the power switching amplifier 2 into a continuous time signal and transfers the continuous time signal to a speaker.

In the conventional pulse width modulation type audio amplifier, since the output signal is switched at a high speed and amplitude of the pulse is relatively large, a spike type pulse is successively occurred, so that electromagnetic interference (EMI) is occurred on the peripheral equipments. Moreover, the higher the average switching frequency of the pulse width modulation type audio amplifier is, the greater electric power consumed in the switching operation, power efficiency of the amplifier is deteriorated. Since the average switching frequency is always fixed to a high frequency, these drawbacks are more remarkable when the fixed high frequency is applied to even an input signal of low bandwidth of frequency.

SUMMARY OF THE INVENTION

Therefore, it is an object of the present invention to provide a pulse width modulation type audio amplifier for decreasing the electromagnetic interference and enhancing electric power efficiency than the conventional pulse width modulation type amplifier which has used the fixed average switching frequency.

In the present invention, in order to use a low switching frequency as possible in accordance with a bandwidth of an input audio signal, an average switching frequency of an output pulse is set different according to the bandwidth of the input audio signal.

The present invention provides a pulse width modulation type audio signal amplifying method for switching power amplifying an input audio signal after a pulse width modulation of the input audio signal in accordance with an average switching frequency, the method including the step of detecting a bandwidth of the input signal, and varying the average switching frequency in accordance with the detected bandwidth of the input signal.

The method of the present invention further includes a filtering step of eliminating a high frequency component from the switching power amplified pulse width modulation signal. A cutoff frequency of a low pass filter used in the filtering step is varied in accordance with the average switching frequency.

Moreover, the present invention provides a pulse width modulation type audio amplifier including a pulse width modulator for pulse width modulating an input audio signal according to an average switching frequency, and a switching power amplifier for switching power amplifying a pulse width modulation signal outputted from the pulse width modulator, the pulse width modulation type audio amplifier including an input signal bandwidth detector for detecting a frequency bandwidth of the input audio signal, and an average switching frequency controller for varying the average switching frequency of the pulse width modulator in accordance with an information of the frequency bandwidth detected by the input signal bandwidth detector.

The average switching frequency is varied in accordance with the bandwidth of the input audio signal.

According to the aspect of the present invention, when the present invention is applied to a multi-channel amplifier, an average switching frequency different to each other for each channel having respect different bandwidth is used. In a low bandwidth signal channel for a subwoofer, an average switching frequency lower than that of an input signal having a bandwidth of a usual audio input signal is used.

According to the aspect of the present invention, the bandwidth of the input audio signal is detected by determining identical or most similar bandwidth to the input audio signal out of predetermined signal bandwidths for a variety of audio signals. The detection of bandwidth of a input signal is based on the clock information of a digital input signal, Fourier transformed information of a digital input signal, or amplitudes of signals acquired after passing a analogue input signal through at least a low pass filter, a high pass filter, and a band pass filter having different passing bandwidth, respectively.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

A preferred embodiment of an audio amplifier according to the present invention will now be described with reference to the attached drawings.

Figure 1:
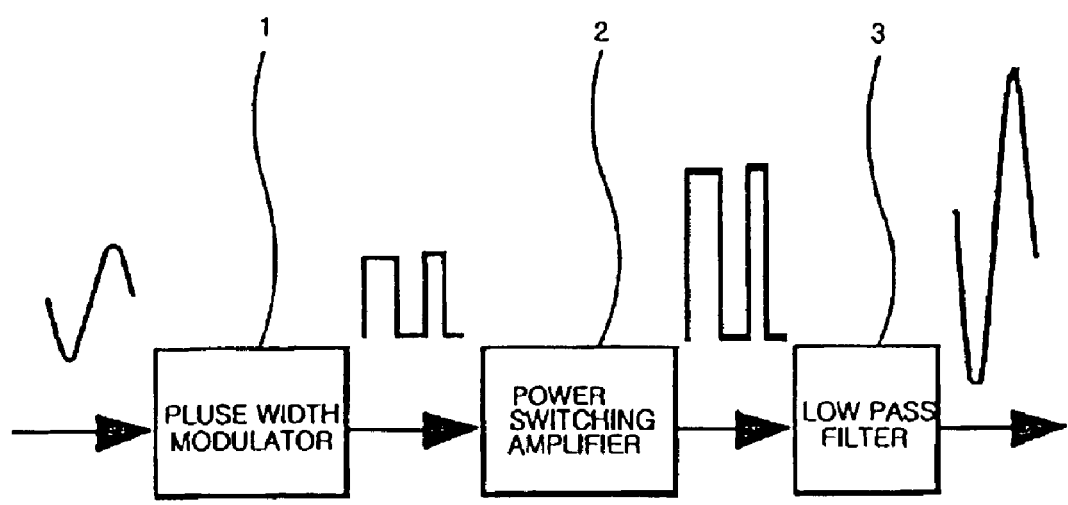
FIG. 1 is a block diagram showing a conventional pulse width modulation type audio amplifier.
Figure 2:
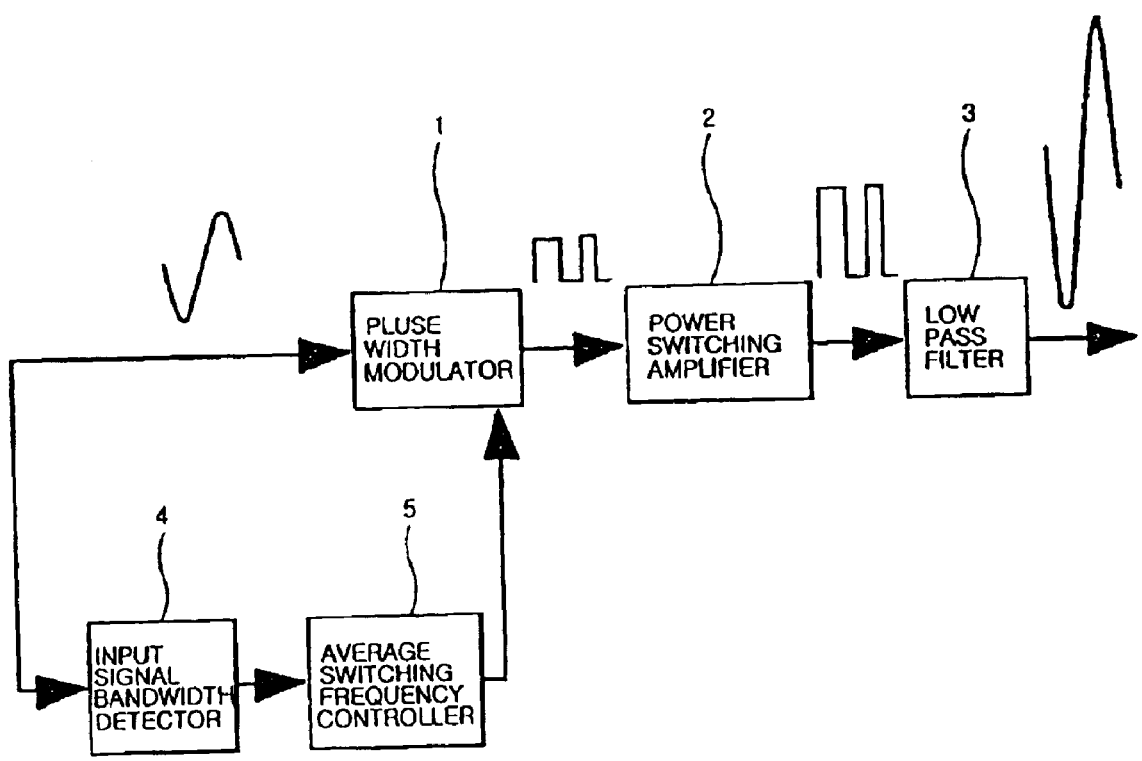
FIG. 2 is a block diagram showing a pulse width modulation type audio amplifier of variable average switching frequency according to the present invention.

FIG. 2 is a schematic block diagram showing a pulse width modulation type audio amplifier of variable average switching frequency according to the preferred embodiment of the present invention. In this embodiment, contrary to the conventional pulse width modulation type audio shown in FIG. 1, an input signal bandwidth detector 4 and an average switching frequency controller 5 are additionally connected between an input signal and a pulse width modulator 1.

The input signal bandwidth detector 4 detects range of a frequency bandwidth for the input signal, and the average switching frequency controller 5 determines the average switching frequency of the pulse width modulator 1 using a bandwidth information detected by the input signal bandwidth detector 4.

In the embodiment shown in FIG. 2, a low pass filter having a fixed cutoff frequency is utilized. Since component of the pulse width modulated switching frequency is very higher than a usual audible frequency range, regardless of using the low pass filter having the fixed cutoff frequency, it is possible not only to listen sound of same quality as that of the conventional pulse width modulation type amplifier, but also to reduce the electromagnetic interference and to enhance the power efficiency.

Figure 3:
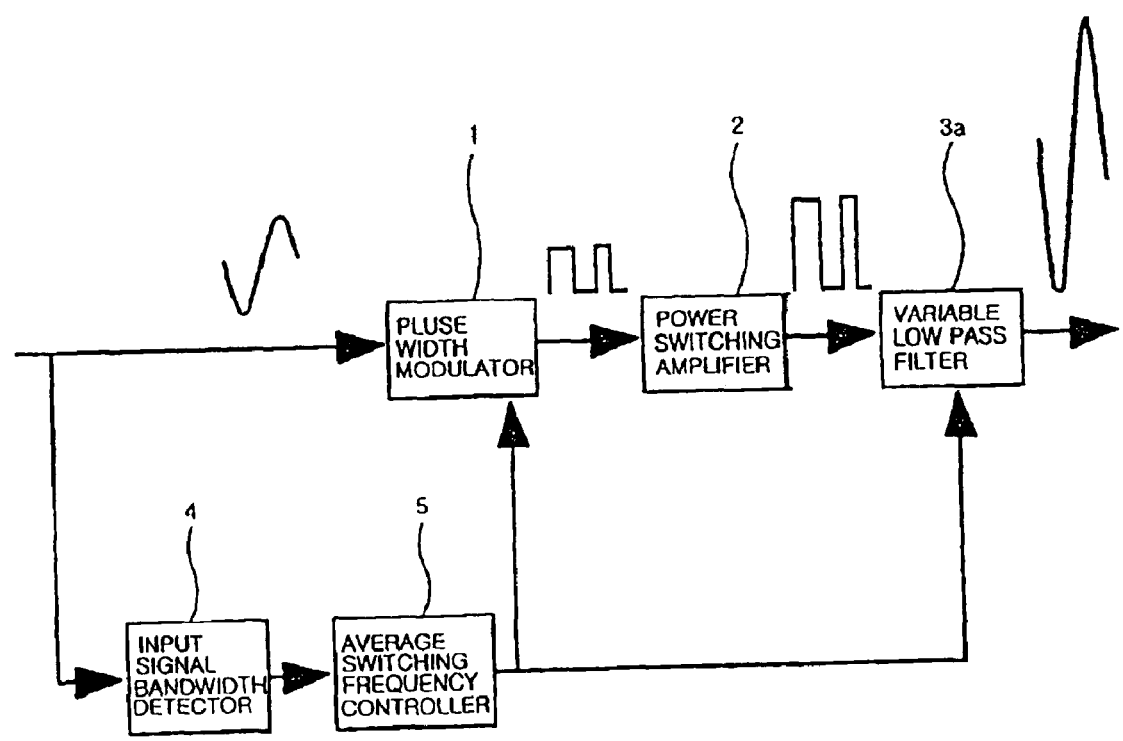
FIG. 3 is a block diagram showing a pulse width modulation type audio amplifier, which an average switching frequency and a cutoff frequency of a low pass filter are variable according to the present invention.

FIG. 3 is a block diagram showing a whole construction of a pulse width modulation type audio amplifier, which an average switching frequency and a cutoff frequency of a low pass filter are variable according to another embodiment of the present invention.

As shown in FIG. 3, a variable low pass filter 3a is connected to the average switching frequency controller 5, and adjusts the cutoff frequency in accordance with a selected average switching frequency. The variable low pass filter 3a is implemented by a variable capacitor or a variable inductor.

As described above in the preferred embodiment shown in FIG. 2, though the effect of the present invention can be substantially achieved even by the low pass filter of the fixed cutoff frequency, the more enhanced sound quality can be achieved by applying the variable average switching frequency even to the cutoff frequency of the low pass filter.

There can be used a method or an apparatus for detecting the bandwidth of the input audio signal by determining identical or most similar bandwidth to the input audio signal out of predetermined signal bandwidths for a variety of audio signals, based on the information about frequency bandwidth, such as a sampling frequency or a threshold frequency. The detection of bandwidth of a digital input signal is based on the clock information of the digital input signal like a sampling frequency, or Fourier transformed information of the digital input signal. The detection of bandwidth of a analogue input signal is accomplished by analyzing amplitudes of signals acquired after passing the analogue input signal through at least a low pass filter, a high pass filter, and a band pass filter having different passing bandwidth, respectively.

If the present invention is applied to a amplitude modulation type radio signal, since baseband signal occupies only bandwidth below 5 kHz, ½ or ¼ of average switching frequency for usual audio input signal of bandwidth of 20 kHz can be used, and a cutoff frequency of a low pass filter is also used by reducing it at the same rate.

If applying the preferred embodiment of the present invention to a multi-channel amplifier, since one channel of the multi-channel may use different bandwidth from bandwidth of another channel, the average switching frequency or the cutoff frequency of the low pass filter of one channel can be set different from those of another channel. According to the type of a multi-channel amplifier, a portion or all of channels may be operated at different switching frequency from each other. In particular, a low bandwidth signal of a channel of a subwoofer included in the multi-channel amplifier can use the average switching frequency lowered to ¼ or ⅛ of the average switching frequency for 20 kHz audio signal or the cutoff frequency of the low pass filter.

According to the present invention, by using the average switching frequency within unavoidable audible frequency and by using the average switching frequency as lowered as possible in accordance with an inputted signal, the power efficiency is enhanced by minimizing the number of switching, the electromagnetic interference phenomenon due to a high frequency component generated by a high switching. Therefore, it is can be designed a more stable and high reliable audio amplifier.

What is claimed is:

1. A pulse width modulation type audio signal amplifying method for switching power amplifying an input audio signal after a pulse width modulation of the input audio signal in accordance with a predetermined average switching frequency, the method comprising the steps of:

detecting a bandwidth of the input signal;

varying the average switching frequency in accordance with the detected bandwidth of the input signal;

eliminating a high frequency component from the switching power amplified pulse width modulation signal, and varying a cutoff frequency of a low pass filter used in the filtering step in accordance with the average switching frequency.

2. A pulse width modulation type audio signal amplifying method for switching power amplifying an input audio signal after a pulse width modulation of the input audio signal in accordance with a predetermined average switching frequency, the method comprising the steps of:

detecting a bandwidth of the input signal;

varying the average switching frequency in accordance with the detected bandwidth of the input signal;

wherein the average switching frequency is varied to be set low in accordance with the bandwidth of the input audio signal.

3. A pulse width modulation type audio signal amplifying method for switching power amplifying an input audio signal after a pulse width modulation of the input audio signal in accordance with a predetermined average switching frequency, the method comprising the steps of:

detecting a bandwidth of the input signal;

varying the average switching frequency in accordance with the detected bandwidth of the input signal;

wherein an average switching frequency for first channel is different from an average switching frequency for second channel which has a different frequency bandwidth from that of the first channel in a multi-channel amplifying.

4. A pulse width modulation type audio signal amplifying method for switching power amplifying an input audio signal after a pulse width modulation of the input audio signal in accordance with a predetermined average switching frequency, the method comprising the steps of:

detecting a bandwidth of the input signal;

varying the average switching frequency in accordance with the detected bandwidth of the input signal;

wherein an average switching frequency lower than an average switching frequency for an input signal having a bandwidth of a usual audio signal is used in a low bandwidth signal channel for a subwoofer.

5. A pulse width modulation type audio signal amplifying method for switching power amplifying an input audio signal after a pulse width modulation of the input audio signal in accordance with a predetermined average switching frequency, the method comprising the steps of:
   detecting a bandwidth of the input signal;
   varying the average switching frequency in accordance with the detected bandwidth of the input signal;
   wherein an average switching frequency, when the input audio signal is the low bandwidth signal for the subwoofer, is used to be lowered to approximately ¼ or ⅛ of an average switching frequency used for an input audio signal of a bandwidth of 20 kHz.

6. A pulse width modulation type audio signal amplifying method for switching power amplifying an input audio signal after a pulse width modulation of the input audio signal in accordance with a predetermined average switching frequency, the method comprising the steps of:
   detecting a bandwidth of the input signal;
   varying the average switching frequency in accordance with the detected bandwidth of the input signal;
   wherein the average switching frequency, when the input audio signal is AM/FM broadcasting audio signal, is to be lower than an average switching frequency for an input audio signal having a bandwidth of a usual audio signal.

7. A pulse width modulation type audio signal amplifying method for switching power amplifying an input audio signal after a pulse width modulation of the input audio signal in accordance with a predetermined average switching frequency, the method comprising the steps of:
   detecting a bandwidth of the input signal;
   varying the average switching frequency in accordance with the detected bandwidth of the input signal;
   wherein the average switching frequency, when the input audio signal is AM/FM broadcasting audio signal, is used to be lowered to approximate ½ or ¼ of an average switching frequency for an input audio signal having a bandwidth of approximate 20 kHz.

8. A pulse width modulation type audio signal amplifying method for switching power amplifying an input audio signal after a pulse width modulation of the input audio signal in accordance with a predetermined average switching frequency, the method comprising the steps of:
   detecting a bandwidth of the input signal;
   varying the average switching frequency in accordance with the detected bandwidth of the input signal;
   eliminating a high frequency component from the switching power amplified pulse width modulation signal,
   varying a cutoff frequency of a low pass filter used in the filtering stay in accordance with the average switching frequency,
   wherein the cutoff frequency is varied using a variable inductor or/and a variable capacitor in the low pass filter.

9. A pulse width modulation type audio signal amplifying method for switching power amplifying an input audio signal after a pulse width method modulation of the input audio signal in accordance with a predetermined average switching frequency, the method comprising the steps of:
   detecting a bandwidth of the input signal;
   varying the average switching frequency in accordance with the detected bandwidth of the input signal;
   wherein the bandwidth of the input audio signal is detected by determining identical or the most similar bandwidth to the input audio signal out of predetermined signal bandwidths for a variety of audio signals.

10. A pulse width modulation type audio signal amplifying method for switching power amplifying an input audio signal after a pulse width modulation of the input audio signal in accordance with a predetermined average switching frequency, the method comprising the steps of:
    detecting a bandwidth of the input signal;
    varying the average switching frequency in accordance with the detected bandwidth of the input signal;
    wherein the detection of bandwidth of the input signal is based on the clock information of a digital input signal.

11. A pulse width modulation type audio signal amplifying method for switching power amplifying an input audio signal after a pulse width modulation of the input audio signal in accordance with a predetermined average switching frequency, the method comprising the steps of:
    detecting a bandwidth of the input signal;
    varying the average switching frequency in accordance with the detected bandwidth of the input signal;
    wherein the detection of bandwidth of the input signal is based on the Fourier transformed information of a digital input signal.

12. A pulse width modulation type audio signal amplifying method far switching power amplifying an input audio signal after a pulse width modulation of the input audio signal in accordance with a predetermined average switching frequency, the method comprising the steps of:
    detecting a bandwidth of the input signal;
    varying the average switching frequency in accordance with the detected bandwidth of the input signal;
    wherein the detection of bandwidth of the input signal is based on amplitudes of signals acquired after passing a analogue input signal through at least a low pass filter, a high pass filter, and a band pass filter having different passing bandwidth, respectively.

13. A pulse width modulation type audio amplifier comprising a pulse width modulator for pulse width modulating an input audio signal according to a average switching frequency, and a switching power amplifier for switching power amplifying a pulse width modulation signal outputted from the pulse width modulator, the pulse width modulation type audio amplifier comprising:
    an input signal bandwidth detector for detecting a frequency bandwidth of the input audio signal;
    an average switching frequency controller for varying the average switching frequency of the pulse width modulator in accordance with an information of the frequency bandwidth detected by the input signal bandwidth detector;
    a low pass filter for eliminating a high frequency component from a pulse width modulation signal amplified by the switching power amplifier, and
    means for varying a passing bandwidth of the low pass filter in accordance with the average switching frequency being varied by the average switching frequency controller.

14. A pulse width modulation type audio amplifier comprising a pulse width modulator for pulse width modulating an input audio signal according to a average switching frequency, and a switching power amplifier for switching power amplifying a pulse width modulation signal outputted from the pulse width modulator, the pulse width modulation type audio amplifier comprising:

an input signal bandwidth detector for detecting a frequency bandwidth of the input audio signal;

an average switching frequency controller for varying the average switching frequency of the pulse width modulator in accordance with an information of the frequency bandwidth detected by the input signal bandwidth detector;

wherein the variable average switching frequency is varied to be set low in accordance with the input audio signal.

15. A pulse width modulation type audio amplifier comprising a pulse width modulator for pulse width modulating an input audio signal according to a average switching frequency, and a switching power amplifier for switching power amplifying a pulse width modulation signal outputted from the pulse width modulator, the pulse width modulation type audio amplifier comprising:

an input signal bandwidth detector for detecting a frequency bandwidth of the input audio signal;

an average switching frequency controller for varying the average switching frequency of the pulse width modulator in accordance with an information of the frequency bandwidth detected by the input signal bandwidth detector;

wherein the input signal bandwidth detector, which have information about predetermined signal bandwidths for a variety of audio signals, further comprises means for determining identical or the most similar bandwidth to the input audio signal out of the predetermined signal bandwidths for a variety of audio signals based on the information.

16. A pulse width modulation type audio amplifier comprising a pulse width modulator for pulse width modulating an input audio signal according to a average switching frequency, and a switching power amplifier for switching power amplifying a pulse width modulation signal outputted from the pulse width modulator, the pulse width modulation type, audio amplifier comprising:

an input signal bandwidth detector for detecting a frequency bandwidth of the input audio signal;

an average switching frequency controller for varying the average switching frequency of the pulse width modulator in accordance with an information of the frequency bandwidth detected by the input signal bandwidth detector;

wherein means for determining further comprises a detector of the clock information of a digital input signal.

17. A pulse width modulation type audio amplifier comprising a pulse width modulator for pulse width modulating an input audio signal according to a average switching frequency, and a switching power amplifier for switching power amplifying a pulse width modulation signal outputted from the pulse width modulator, the pulse width modulation type audio amplifier comprising:

an input signal bandwidth detector for detecting a frequency bandwidth at the input audio signal;

an average switching frequency controller for varying the average switching frequency of the pulse width modulator in accordance with an information of the frequency bandwidth detected by the input signal bandwidth detector;

wherein means for determining further comprises a high speed Fourier transformer of a digital input signal.

18. A pulse width modulation type audio amplifier comprising a pulse width modulator for pulse width modulating an input audio signal according to a average switching frequency, and a switching power amplifier for switching power amplifying a pulse width modulation signal outputted from the pulse width modulator, the pulse width modulation type audio amplifier comprising:

an input signal bandwidth detector for detecting a frequency bandwidth of the input audio signal;

an average switching frequency controller for varying the average switching frequency of the pulse width modulator in accordance with an information of the frequency bandwidth detected by the input signal bandwidth detector;

wherein means for determining further comprises at least a low pass filter, a high pass filter, and a band pass filter, and the determination of bandwidth is based on amplitudes of signals acquired after passing a analogue input signal through the above filters, respectively.

19. A pulse width modulation type audio amplifier comprising a pulse width modulator for pulse width modulating an input audio signal according to a average switching frequency, and a switching power amplifier for switching power amplifying a pulse width modulation signal outputted from the pulse width modulator, the pulse width modulation type audio amplifier comprising:

an input signal bandwidth detector for detecting a frequency bandwidth of the input audio signal;

an average switching frequency controller for varying the average switching frequency of the pulse width modulator in accordance with an information of the frequency bandwidth detected by the input signal bandwidth detector;

wherein an average switching frequency for first channel is different from an average switching frequency for second channel which have a different frequency bandwidth from that of the first channel.

* * * * *